(12) United States Patent
Hsiao et al.

(10) Patent No.: US 12,464,673 B2
(45) Date of Patent: Nov. 4, 2025

(54) IMMERSION COOLING SYSTEM AND BUSBAR PROTECTION MODULE THEREOF

(71) Applicant: Wiwynn Corporation, New Taipei (TW)

(72) Inventors: Ching-Wen Hsiao, New Taipei (TW); Yun-Ya Chiu, New Taipei (TW); Hsien-Chieh Hsieh, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 244 days.

(21) Appl. No.: 18/232,813

(22) Filed: Aug. 10, 2023

(65) Prior Publication Data
US 2024/0381570 A1    Nov. 14, 2024

(30) Foreign Application Priority Data
May 11, 2023   (TW) ................ 112117440

(51) Int. Cl.
| | |
|---|---|
| *H05K 7/14* | (2006.01) |
| *H01R 25/14* | (2006.01) |
| *H02G 5/10* | (2006.01) |
| *H05K 7/20* | (2006.01) |
| *H01R 13/453* | (2006.01) |

(52) U.S. Cl.
CPC ......... *H05K 7/20236* (2013.01); *H01R 25/14* (2013.01); *H02G 5/10* (2013.01); *H05K 7/1492* (2013.01); *H05K 7/203* (2013.01); *H01R 13/453* (2013.01)

(58) Field of Classification Search
CPC .. H05K 7/20236; H05K 7/203; H05K 7/1457; H05K 7/1492; H01R 13/447; H01R 13/453; H01R 13/4538; H01R 25/14; H02G 5/10; H02B 1/14
See application file for complete search history.

(56) References Cited

U.S. PATENT DOCUMENTS

| | | | | |
|---|---|---|---|---|
| 5,327,321 | A | * | 7/1994 | Rosen ................ H02B 1/14 361/617 |
| 5,885,095 | A | * | 3/1999 | Cohen ............... H01R 12/7005 439/138 |
| 7,699,635 | B2 | * | 4/2010 | Weaver .............. H05K 7/1076 439/930 |
| 11,846,385 | B2 | * | 12/2023 | Fei ...................... F16M 11/24 |
| 2023/0010833 | A1 | * | 1/2023 | Fei ...................... F16M 11/2014 |
| 2024/0322507 | A1 | * | 9/2024 | Oseen-Senda ....... H05K 7/1457 |

* cited by examiner

*Primary Examiner* — Robert J Hoffberg
(74) *Attorney, Agent, or Firm* — Winston Hsu (57) ABSTRACT

An immersion cooling system includes a cooling tank, a busbar and two busbar protection modules. The busbar is disposed in the cooling tank. The two busbar protection modules are disposed at opposite sides of the busbar. Each of the two busbar protection modules includes a base, a driving member and a cover. The driving member is pivotally connected to the base. The cover is pivotally connected to the driving member. Two covers of the two busbar protection modules extend toward each other to cover the busbar. When two driving members of the two busbar protection modules are pushed, the two driving members rotate to drive the two covers to move away from each other, such that the busbar is exposed between the two covers.

22 Claims, 9 Drawing Sheets

IMMERSION COOLING SYSTEM AND BUSBAR PROTECTION MODULE THEREOF

BACKGROUND OF THE INVENTION

1. Field of the Invention

The invention relates to an immersion cooling system and a busbar protection module thereof and, more particularly, to a busbar protection module capable of reducing operation space and an immersion cooling system equipped with the busbar protection module.

2. Description of the Prior Art

An immersion cooling system uses a cooling liquid to dissipate heat from electronic components by a phase change manner. At present, some immersion cooling systems dispose a busbar in a cooling tank, so as to utilize the busbar to supply power for electronic components in the cooling tank. In general, the busbar is disposed at a bottom of the cooling tank and has high voltage. If an object falls on the busbar, an electrical connector of the electronic component may be damaged, and even short circuit and fire may occur.

SUMMARY OF THE INVENTION

According to an embodiment of the invention, an immersion cooling system comprises a cooling tank, a busbar and two busbar protection modules. The busbar is disposed in the cooling tank. The two busbar protection modules are disposed at opposite sides of the busbar. Each of the two busbar protection modules comprises a base, a driving member and a cover. The driving member is pivotally connected to the base. The cover is pivotally connected to the driving member. Two covers of the two busbar protection modules extend toward each other to cover the busbar. When two driving members of the two busbar protection modules are pushed, the two driving members rotate to drive the two covers to move away from each other, such that the busbar is exposed between the two covers.

According to an embodiment of the invention, a busbar protection module comprises a base, a driving member and a cover. The driving member is pivotally connected to the base. The driving member comprises a push portion, a connecting portion and an upright portion. The push portion extends obliquely from the connecting portion. The upright portion extends upward from the connecting portion and is opposite to the push portion. The cover is pivotally connected to the upright portion.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
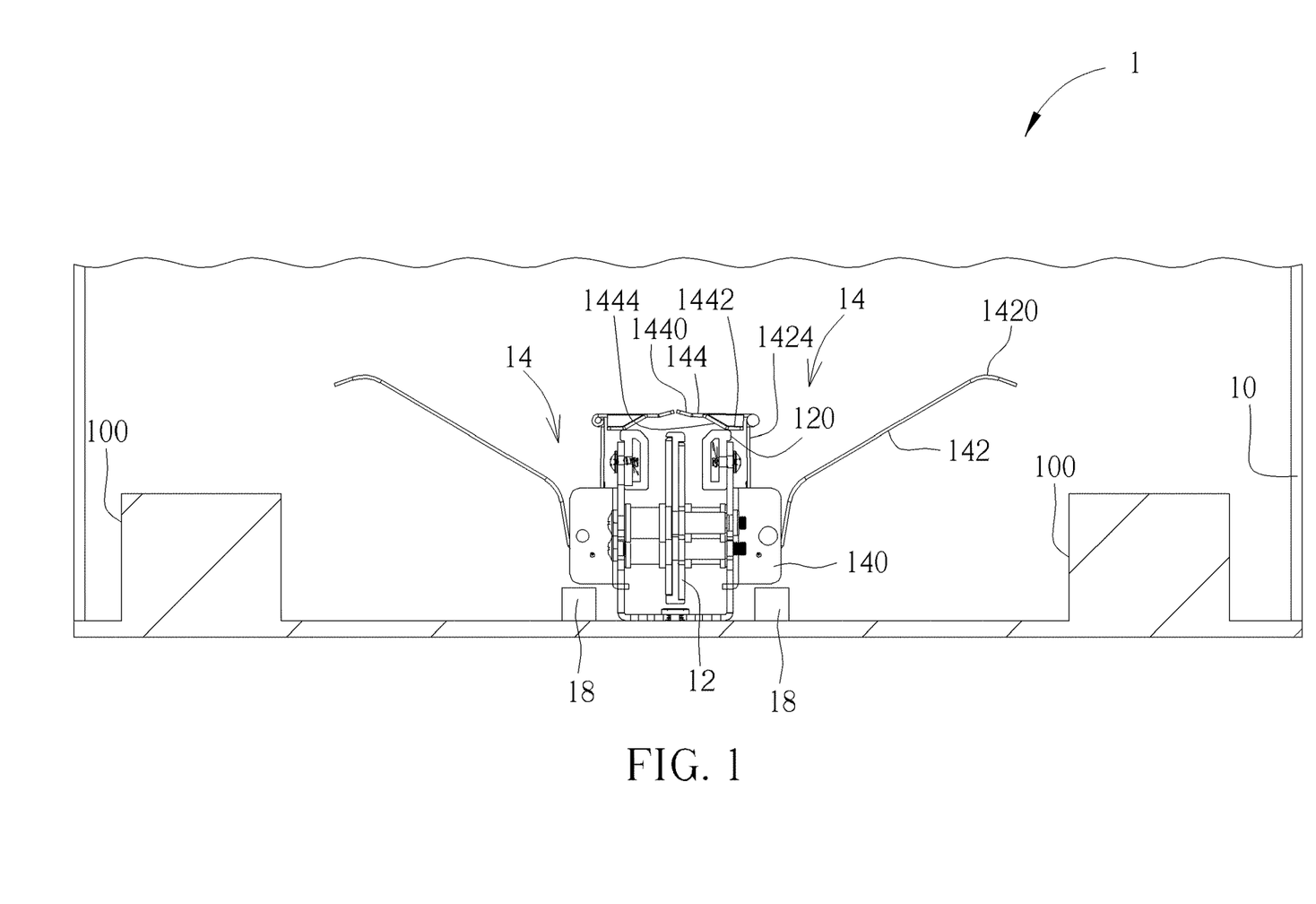
FIG. 1 is a partial schematic view illustrating an immersion cooling system according to an embodiment of the invention.
Figure 2:
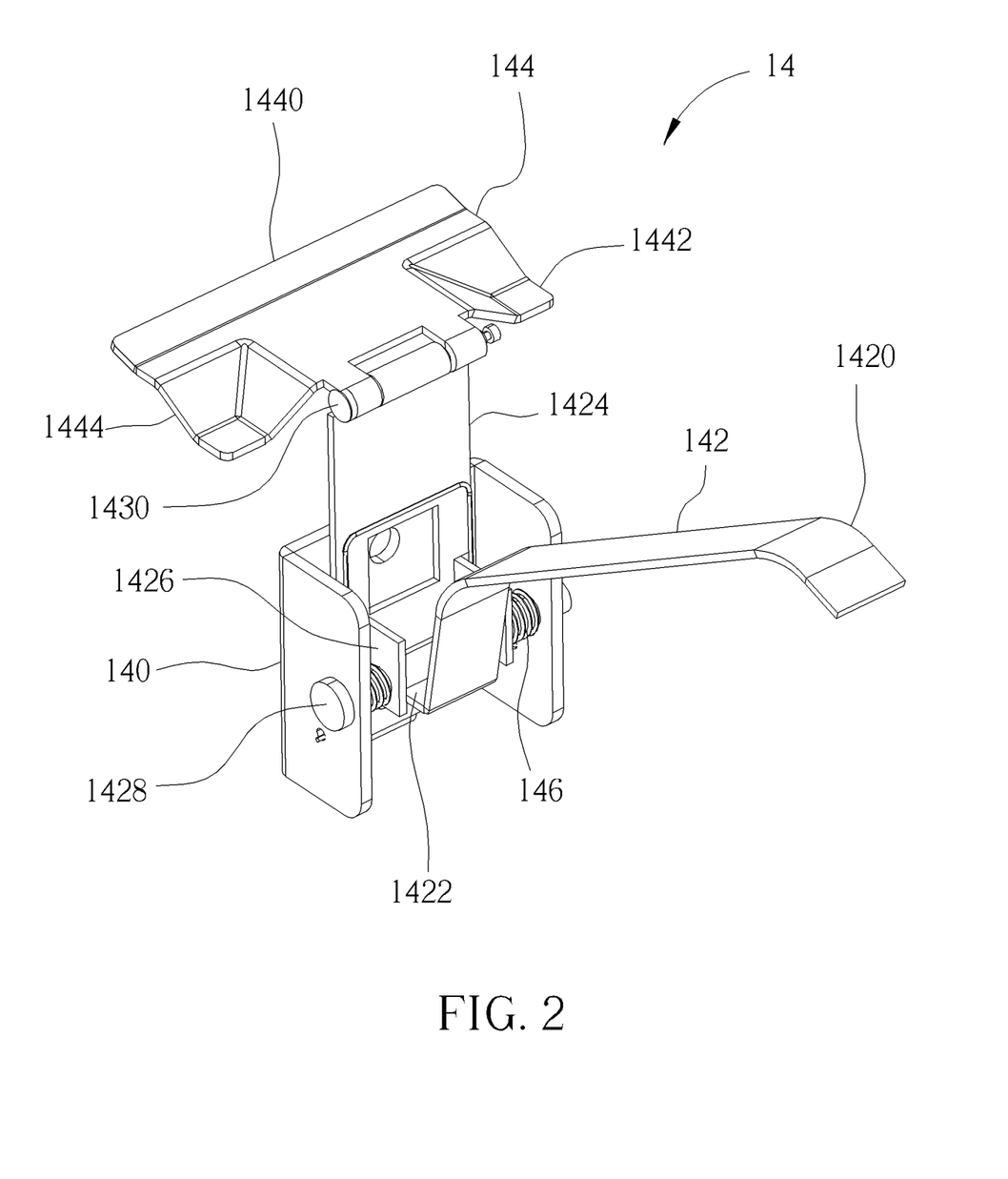
FIG. 2 is a perspective view illustrating a busbar protection module according to an embodiment.
Figure 3:
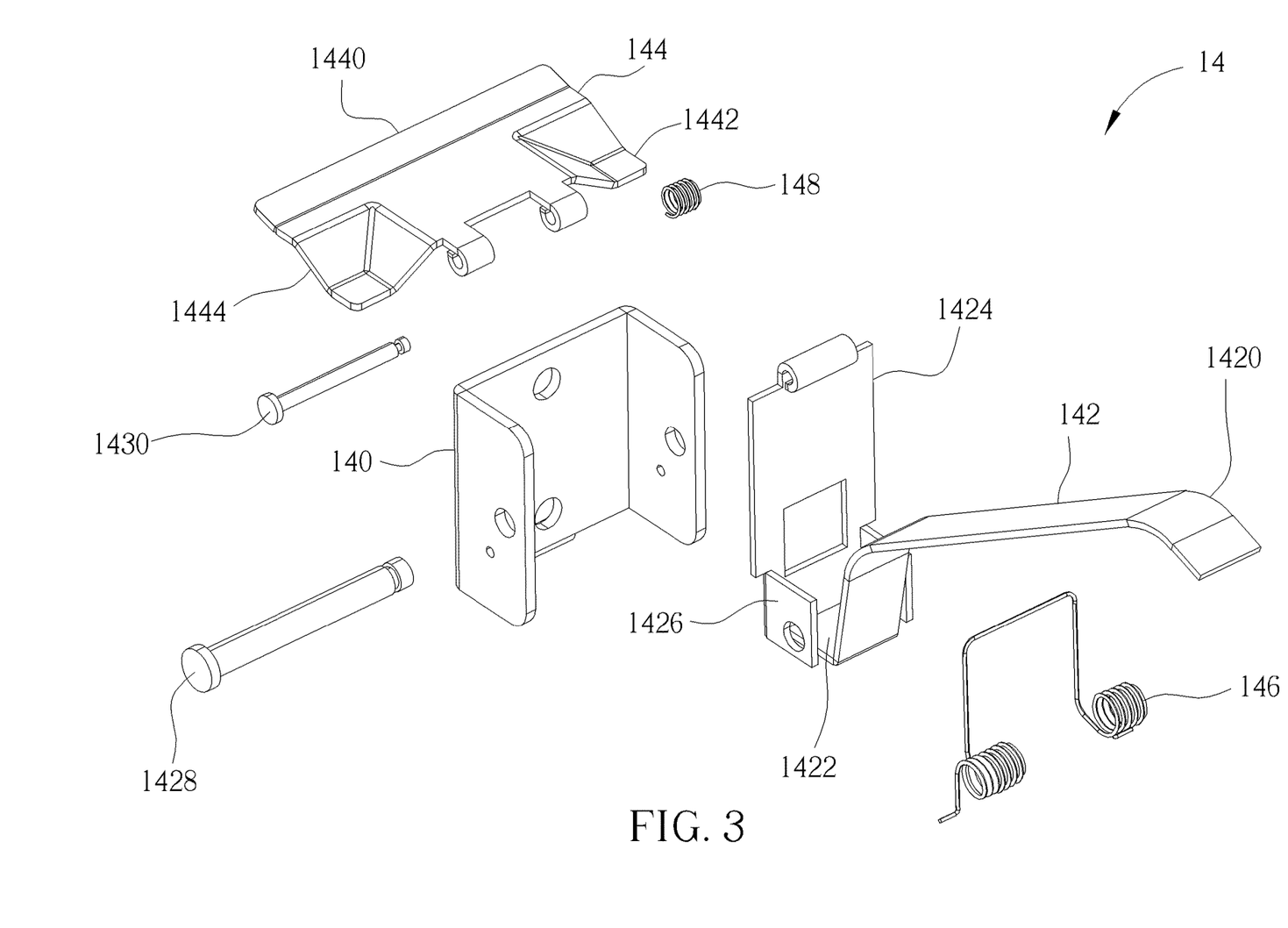
FIG. 3 is an exploded view illustrating a busbar protection module according to an embodiment.
Figure 4:
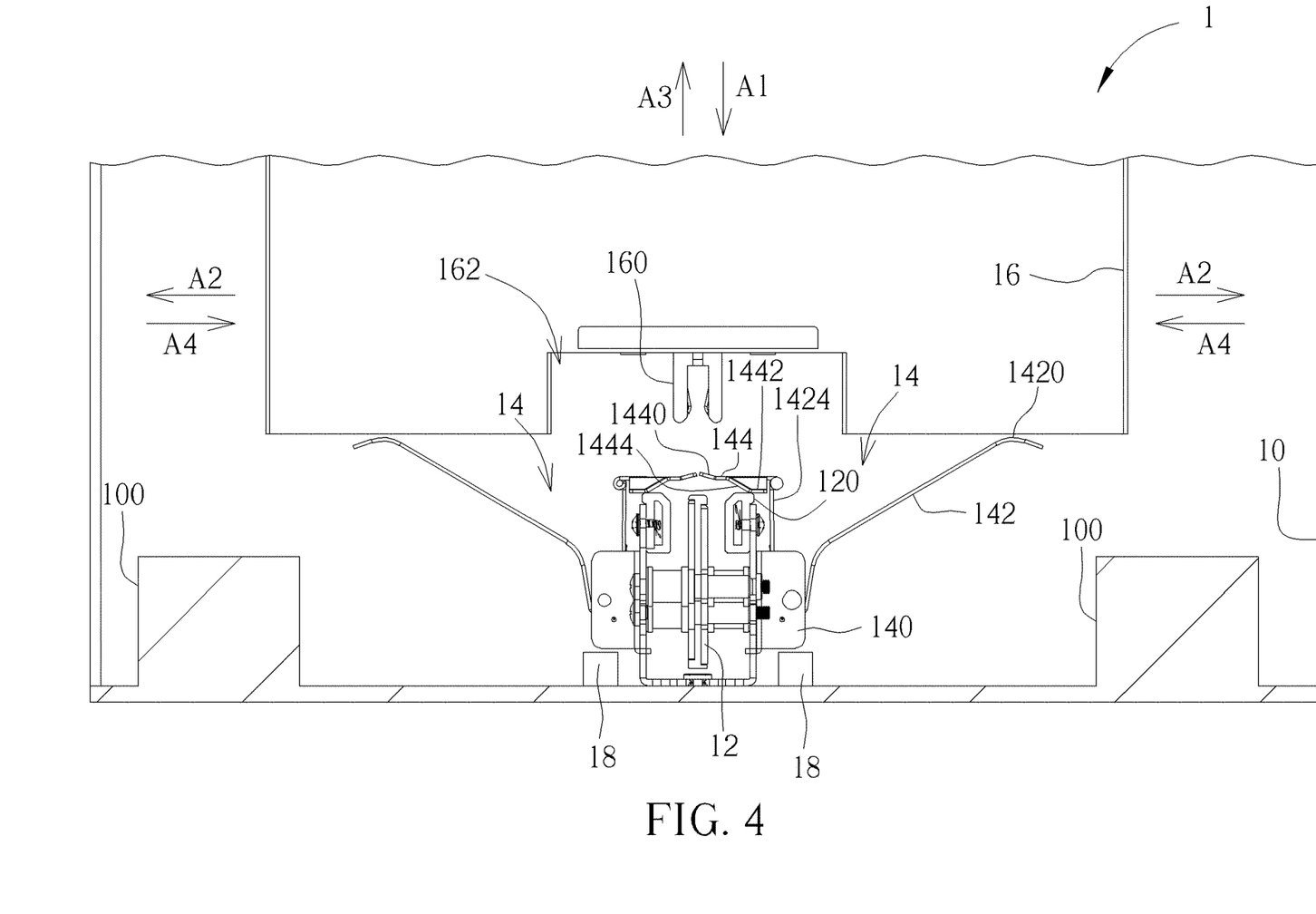
FIGS. 4 to 6 are schematic views illustrating a data processing device being installed to a busbar according to an embodiment.
Figure 5:
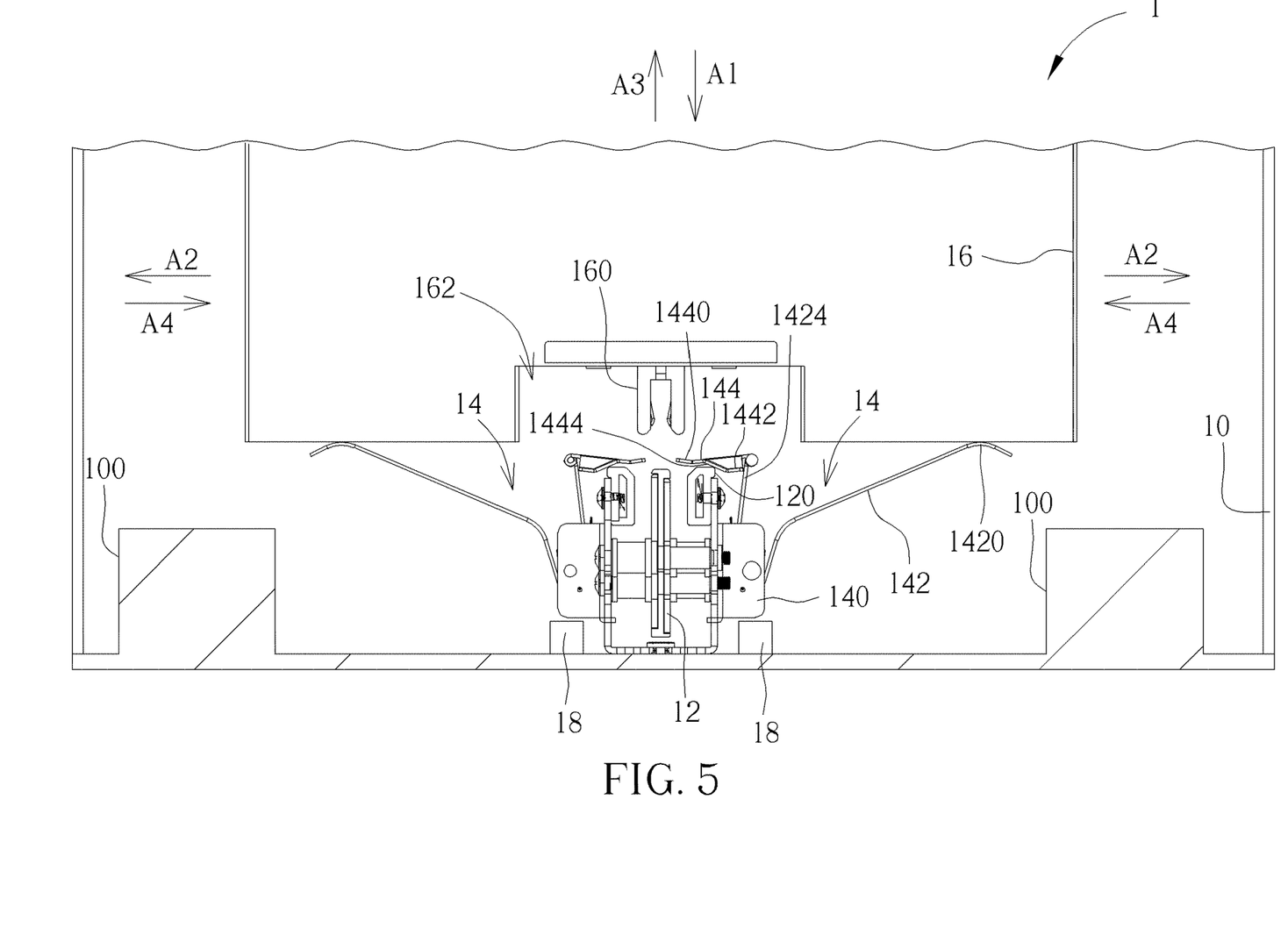
Figure 6:
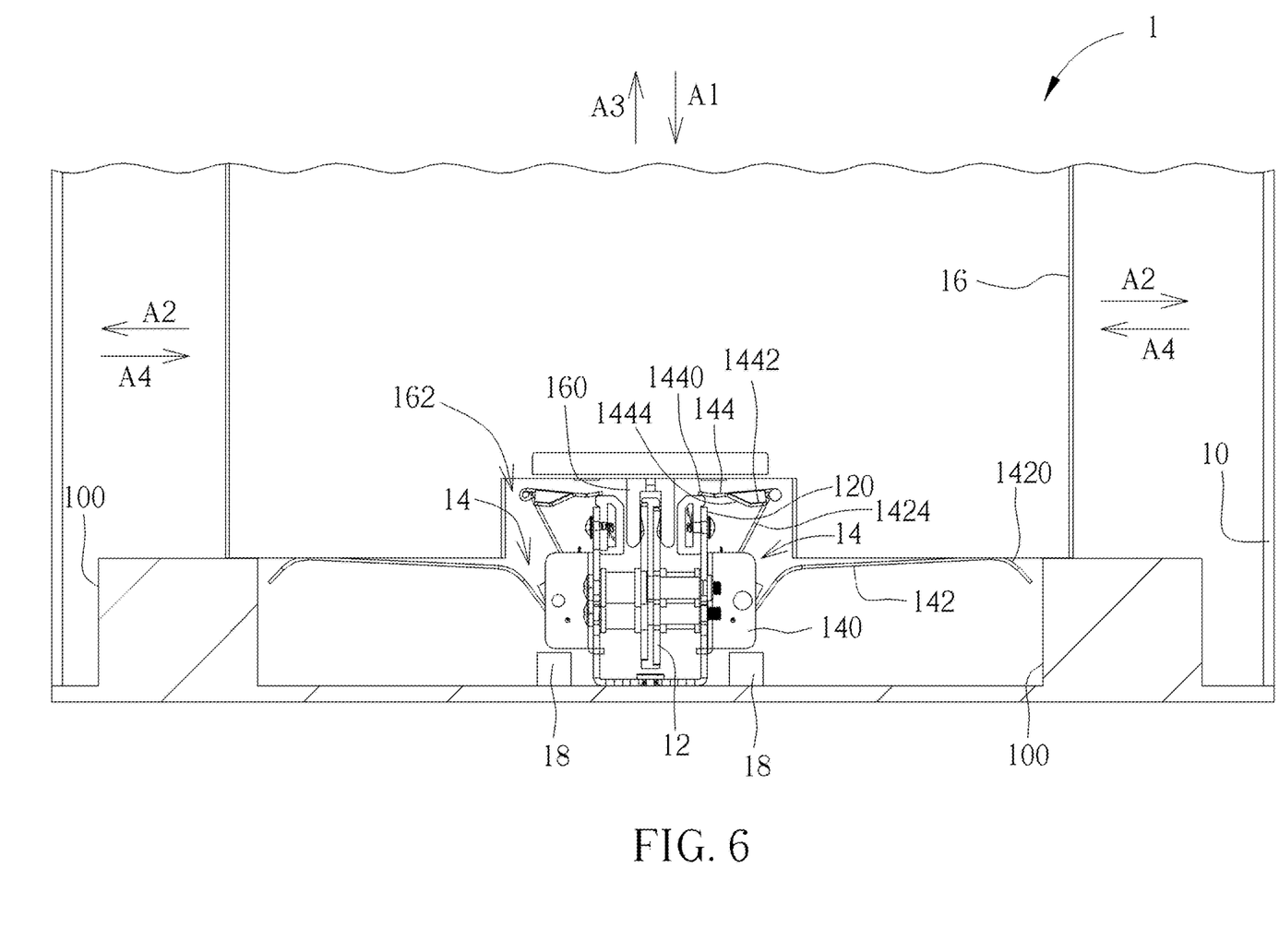

Referring to FIGS. 1 to 6, FIG. 1 is a partial schematic view illustrating an immersion cooling system 1 according to an embodiment of the invention, FIG. 2 is a perspective view illustrating a busbar protection module 14 according to an embodiment, FIG. 3 is an exploded view illustrating a busbar protection module 14 according to an embodiment, and FIGS. 4 to 6 are schematic views illustrating a data processing device 16 being installed to a busbar 12 according to an embodiment.

As shown in FIGS. 1 to 6, the immersion cooling system 1 comprises a cooling tank 10, a busbar 12, two busbar protection modules 14 and a data processing device 16. The cooling tank 10 may store a cooling liquid (e.g. dielectric liquid). The data processing device 16 may be immersed in the cooling liquid of the cooling tank 10 so as to dissipate the heat from the data processing device 16. This arrangement may be implemented in single-phase or two-phase cooling system. For example, in some two-phase cooling applications, the cooling liquid may be provided with a low boiling point to evaporate into gas after absorbing the heat generated by the data processing device 16, so as to dissipate the heat from the data processing device 16. The data processing device 16 may be a server or other electronic devices according to practical applications. The busbar 12 is disposed in the cooling tank 10. In this embodiment, the busbar 12 may be disposed at a bottom of the cooling tank 10 and configured to supply power for the data processing device 16. It should be noted that the number of the busbars 12 and the data processing devices 16 may be determined according to practical applications, so the invention is not limited to the embodiment shown in the figures.

The two busbar protection modules 14 are disposed at opposite sides of the busbar 12, wherein each of the two busbar protection modules 14 comprises a base 140, a driving member 142, a cover 144, a first torsion spring 146 and a second torsion spring 148. As shown in FIGS. 2 and 3, the driving member 142 is pivotally connected to the base 140 and the cover 144 is pivotally connected to the driving member 142. In this embodiment, the driving member 142 may comprise a push portion 1420, a connecting portion 1422, an upright portion 1424 and two pivot portions 1426. The push portion 1420 extends obliquely from the connecting portion 1422. The upright portion 1424 extends upward from the connecting portion 1422 and is opposite to the push portion 1420. In other words, the connecting portion 1422 is connected between the push portion 1420 and the upright portion 1424. The two pivot portions 1426 extend from opposite sides of the upright portion 1424. In this embodiment, the two pivot portions 1426 may be pivotally connected to the base 140 by a first shaft 1428 and the cover 144 may be pivotally connected to the upright portion 1424 by a second shaft 1430.

The first torsion spring 146 may be disposed on the first shaft 1428 and connected to the base 140 and the upright portion 1424 of the driving member 142. When the push portion 1420 is not pushed, a torsion provided by the first torsion spring 146 may keep the driving member 142 at a position shown in FIG. 1. Furthermore, the second torsion spring 148 may be disposed on the second shaft 1430 and connected to the cover 144 and the upright portion 1424 of the driving member 142. When the push portion 1420 is not pushed, a torsion provided by the second torsion spring 148 may keep the cover 144 at a position shown in FIG. 1.

In this embodiment, the two busbar protection modules 14 may be fixed at opposite sides of the busbar 12 by screws or other fixing members. As shown in FIG. 1, after the two busbar protection modules 14 are disposed at opposite sides of the busbar 12, two covers 144 of the two busbar protection modules 14 extend toward each other to cover the busbar 12. In this embodiment, when the two covers 144 cover the busbar 12, two oblique ends 1440 of the two covers 144 are tilted up and arranged side by side. Thus, when an object falls, the two covers 144 may prevent the object from falling on the busbar 12.

In this embodiment, the cover 144 may comprise two concave portions 1442, wherein the two concave portions 1442 are located at two opposite corners of the cover 144. Furthermore, the immersion cooling system 1 may further comprise two collection containers 18, wherein the two collection containers 18 may be disposed adjacent to the two busbar protection modules 14, and the position of the collection container 18 corresponds to the positions of the two concave portions 1442 of the cover 144. Thus, when an object falls, the two concave portions 1442 of the cover 144 may guide the object to the collection container 18, such that the object falls concentratedly in the collection container 18.

A single busbar 12 shown in FIG. 5 corresponds to a single data processing device 16 and a single pair of busbar protection modules 14 (two). However, FIG. 5 only illustrates parts of the immersion cooling system 1. In practice, a single busbar of the immersion cooling system may correspond to a plurality of data processing devices arranged side by side and a plurality of pairs of busbar protection modules respectively corresponding to the data processing devices.

As shown in FIGS. 4 to 6, a user may put the data processing device 16 into the cooling tank 10 toward the busbar 12, so as to utilize the cooling liquid of the cooling tank 10 to dissipate heat from the data processing device 16. When the data processing device 16 moves toward the busbar 12 (the direction indicated by an arrow A1), the data processing device 16 pushes two push portions 1420 of two driving members 142 of the two busbar protection modules 14. As shown in FIGS. 4 and 5, when the two push portions 1420 of the two driving members 142 of the two busbar protection modules 14 are pushed, the two driving members 142 rotate to drive the two covers 144 of the two busbar protection modules 14 to move away from each other (the direction indicated by an arrow A2), such that the busbar 12 is exposed between the two covers 144.

In this embodiment, the data processing device 16 may comprise an electrical connector 160, such as a busbar clip connector. As mentioned in the above, when the data processing device 16 moves toward the busbar 12, the data processing device 16 pushes the two push portions 1420 of the two driving members 142 of the two busbar protection modules 14, such that the electrical connector 160 of the data processing device 16 is connected to the busbar 12 exposed between the two covers 144, as shown in FIG. 6. In other words, as long as the user puts the data processing device 16 into the cooling tank 10 toward the busbar 12, the two covers 144 of the two busbar protection modules 14 will automatically move away from each other to be opened, such that the electrical connector 160 of the data processing device 16 is connected to the busbar 12 exposed between the two covers 144. In this embodiment, the cooling tank 10 may comprise two stop portions 100, wherein the two stop portions 100 are located at the bottom of the cooling tank 10 and at opposite sides of the busbar 12. As shown in FIG. 6, when the electrical connector 160 of the data processing device 16 is connected to the busbar 12, the two stop portions 100 stop the data processing device 16 to restrain the data processing device 16 from moving downward.

When the user wants to take the data processing device 16 out of the cooling tank 10, the user may operate the data processing device 16 to move away from the busbar 12 (the direction indicated by an arrow A3), such that the electrical connector 160 of the data processing device 16 is detached from the busbar 12. At this time, the torsions provided by the first torsion spring 146 and the second torsion spring 148 (as shown in FIG. 3) return the driving member 142 and the cover 144 to the positions shown in FIG. 4, wherein the two covers 144 of the two busbar protection modules 14 move toward each other (the direction indicated by an arrow A4) to cover the busbar 12. In other words, as long as the user takes the data processing device 16 out of the cooling tank 10, the two covers 144 of the two busbar protection modules 14 will automatically move toward each other to be closed, so as to cover the busbar 12.

In this embodiment, a moving direction of the cover 144 (the direction indicated by the arrows A2, A4) is substantially perpendicular to a moving direction of the push portion 1420 of the driving member 142 (the direction indicated by the arrows A1, A3). Accordingly, the movement of the cover 144 does not occupy the space above the busbar 12 and the operation space of the busbar protection module 14 may be reduced.

In this embodiment, the cover 144 may comprise a non-linear abutting surface 1444. Due to the torsion of the second torsion spring 148 shown in FIG. 3, the non-linear abutting surface 1444 abuts against a side wall 120 of the busbar 12 during a movement of the cover 144, as shown in FIGS. 4 to 6. Accordingly, the stability and smoothness of the movement of the cover 144 may be maintained. Furthermore, during the movement of the cover 144, the torsion of the second torsion spring 148 drives the cover 144 against the side wall 120 downward and does not allow the cover 144 to tilt upward, such that it may also prevent the cover 144 from tilting upward to interfere with the data processing device 16. The non-linear abutting surface 1444 may be an arc surface, a curved surface, or consist of a plurality of flat surfaces according to practical applications. The non-linear abutting surface 1444 shown in FIG. 4 forms a bottom surface of the concave portion 1442.

It should be noted that, in another embodiment, the second torsion spring 148 shown in FIG. 3 may also be omitted. At this time, the non-linear abutting surface 1444 may abut against the side wall 120 of the busbar 12 during the movement of the cover 144 by the weight of the cover 144 itself.

An avoidance space 162 is formed around the electrical connector 160 of the data processing device 16 shown in FIG. 5. As shown in FIG. 6, when the electrical connector 160 is connected to the busbar 12 and the data processing device 16 is stopped by the two stop portions 100, the avoidance space 162 of the data processing device 16 is big enough to receive the two covers 144 away from each other, so as to prevent the data processing device 16 from interfering with the cover 144. In fact, as shown in FIG. 6, the cover 144 is located in the avoidance space 162 and apart from the data processing device 16 without interference.

Figure 7:
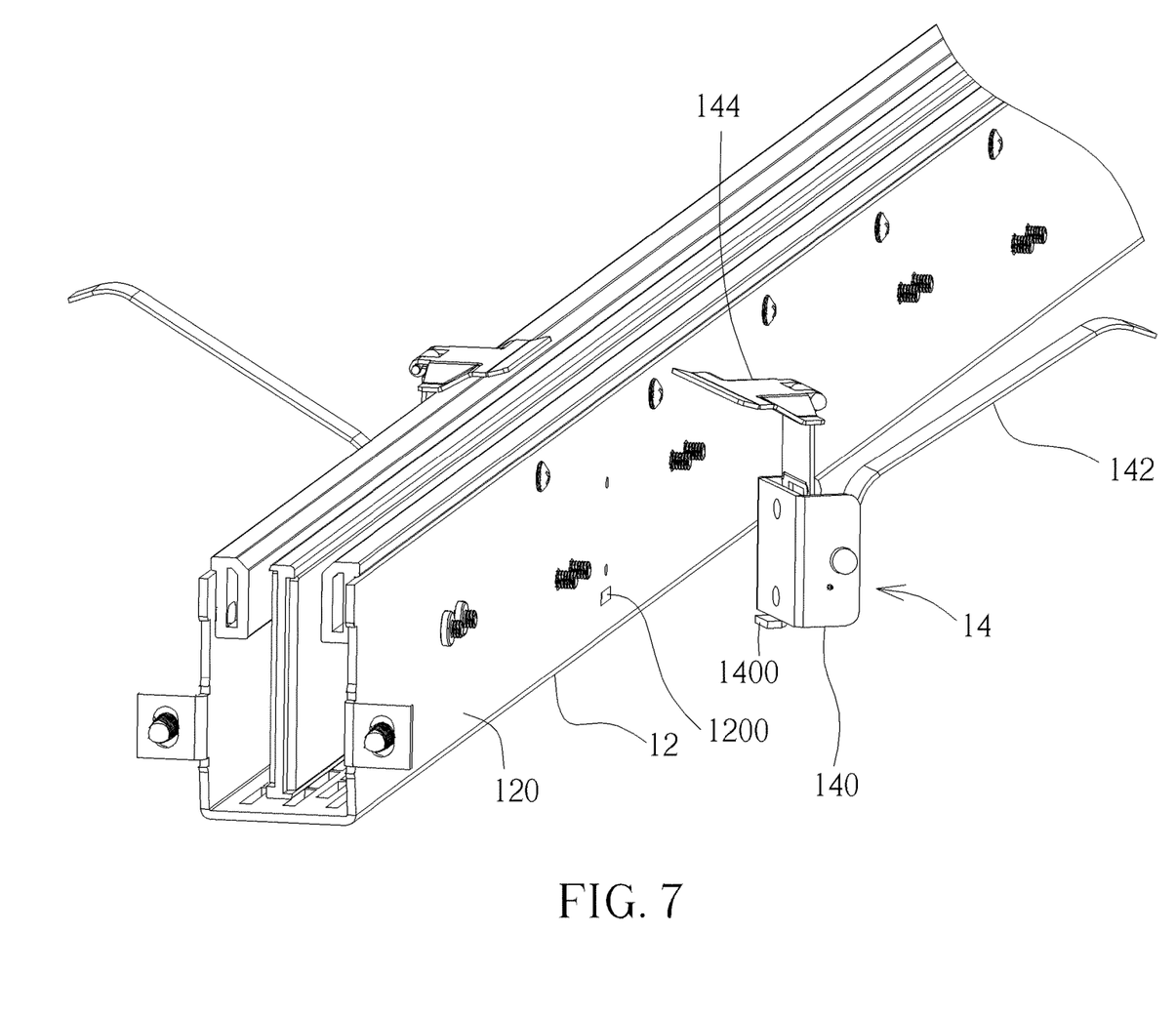
FIG. 7 is an exploded view illustrating a busbar 12 and a busbar protection module 14 according to an embodiment.

Referring to FIG. 7, FIG. 7 is an exploded view illustrating a busbar 12 and a busbar protection module 14 according to an embodiment.

As shown in FIG. 7, the base 140 of the busbar protection module 14 may comprise a positioning portion 1400, and the side wall 120 of the busbar 12 may comprise a positioning hole 1200. To assemble the busbar protection module 14 to the side wall 120 of the busbar 12, the positioning portion 1400 of the base 140 may be inserted into the positioning hole 1200 of the side wall 120 first to position the busbar protection module 14 on the side wall 120 of the busbar 12. Then, the base 140 is fixed to the side wall 120 by screws or other fixing members. Accordingly, through the cooperation between the positioning portion 1400 of the base 140 and the positioning hole 1200 of the side wall 120, the assembly of the bus protection module 14 and the busbar 12 may be more efficient.

Figure 8:
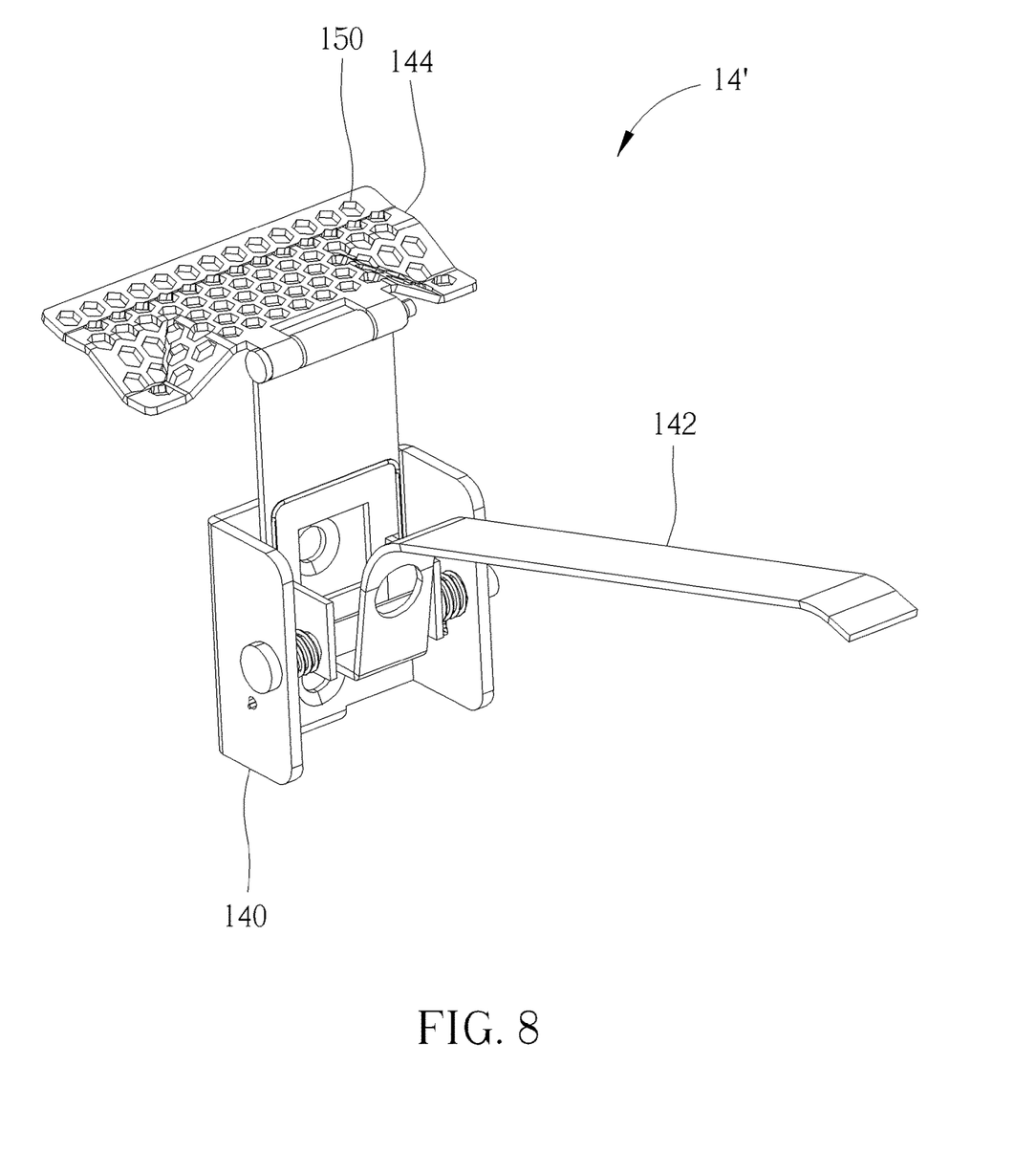
FIG. 8 is a perspective view illustrating a busbar protection module according to another embodiment of the invention.

Referring to FIG. 8, FIG. 8 is a perspective view illustrating a busbar protection module 14' according to another embodiment of the invention.

The main difference between the busbar protection module 14' and the aforesaid busbar protection module 14 is that the cover 144 of the busbar protection module 14' has a plurality of through holes 150 formed thereon. When the busbar protection module 14 shown in FIG. 6 is replaced by the busbar protection module 14' shown in FIG. 8, the cooling liquid of the cooling tank 10 may flow through the through hole 150 to improve the effect of heat dissipation. For example, the through hole 150 may be, but is not limited to, a circular hole with a diameter of about 3 mm, so as to ensure that an object larger than the through hole 150 will not pass through the through hole 150 and fall on the busbar 12.

Figure 9:
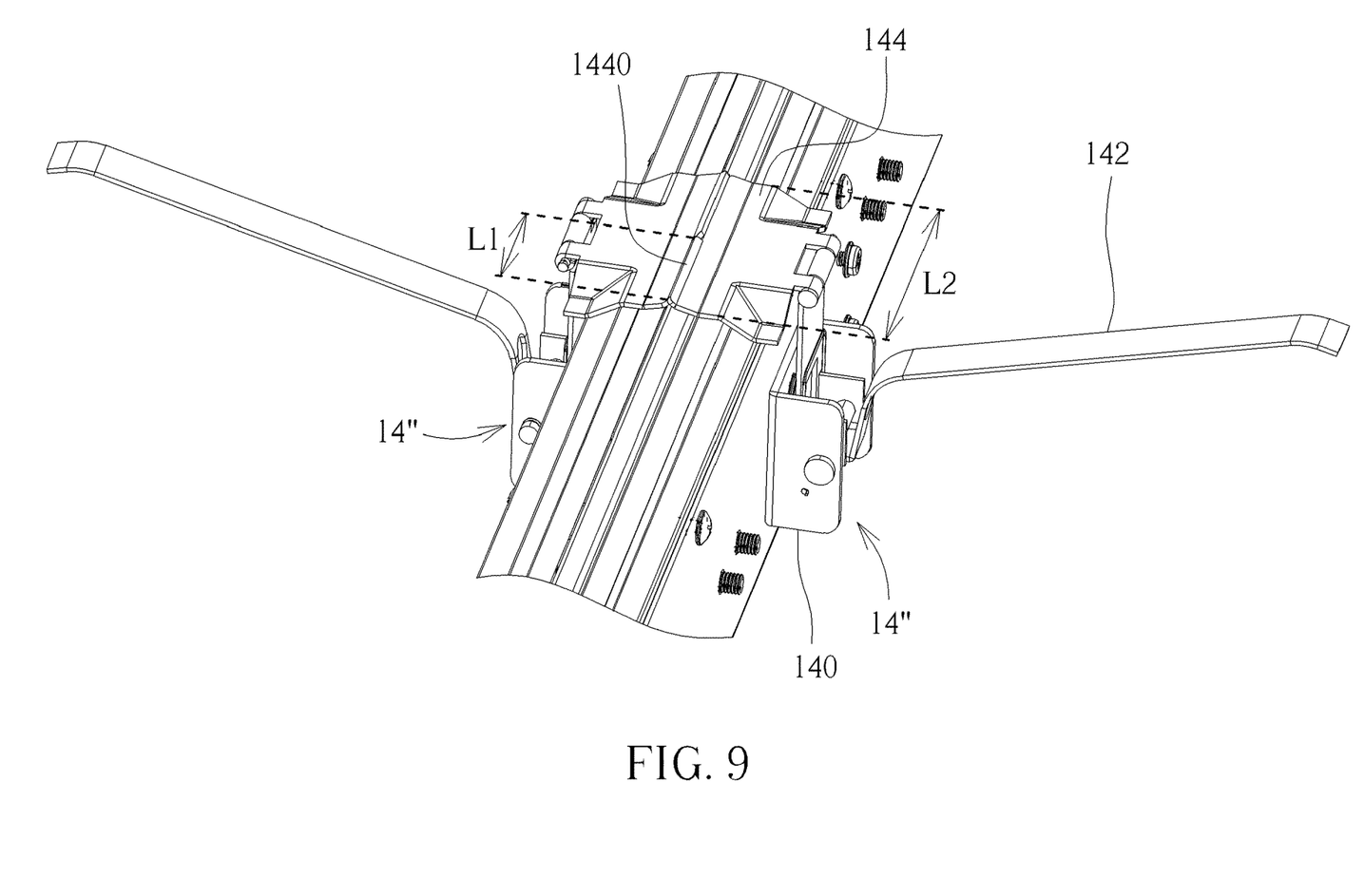
FIG. 9 is a perspective view illustrating two busbar protection modules disposed at opposite sides of a busbar according to another embodiment of the invention.

Referring to FIG. 9, FIG. 9 is a perspective view illustrating two busbar protection modules 14" disposed at opposite sides of a busbar 12 according to another embodiment of the invention.

The main difference between the busbar protection module 14" and the aforesaid busbar protection module 14 is that a length L1 of the oblique end 1440 of the cover 144 of the busbar protection module 14" is smaller than a length L2 of the cover 144. In this embodiment, the length L1 of the oblique end 1440 may be substantially equal to half of the length L2 of the cover 144. Accordingly, as shown in FIG. 9, when the two covers 144 of the two busbar protection modules 14" are closed to cover the busbar 12, two oblique ends 1440 of the two covers 144 are staggered with each other, such that the two covers 144 may cover the busbar 12 more completely.

As mentioned in the above, after the two busbar protection modules are disposed at opposite sides of the busbar, the two covers of the two busbar protection modules extend toward each other to cover the busbar. Accordingly, when an object falls, the two covers may prevent the object from falling on the busbar. When the two driving members of the two busbar protection modules are pushed, the two driving members rotate to drive the two covers to move away from each other. Thus, the movement of the cover does not occupy the space above the busbar and the operation space of the busbar protection module may be reduced. Furthermore, the cover may guide the object to the collection container by the design of the concave portion, such that the object falls concentratedly in the collection container.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An immersion cooling system comprising:
a cooling tank;
a busbar disposed in the cooling tank; and
two busbar protection modules disposed at opposite sides of the busbar, each of the two busbar protection modules comprising a base, a driving member and a cover, the driving member being pivotally connected to the base, the cover being pivotally connected to the driving member;
wherein two covers of the two busbar protection modules extend toward each other to cover the busbar; when two driving members of the two busbar protection modules are pushed, the two driving members rotate to drive the two covers to move away from each other, such that the busbar is exposed between the two covers.

2. The immersion cooling system of claim 1, wherein the driving member comprises a push portion, a connecting portion and an upright portion, the push portion extends obliquely from the connecting portion, and the upright portion extends upward from the connecting portion and is opposite to the push portion.

3. The immersion cooling system of claim 2, wherein a moving direction of the cover is perpendicular to a moving direction of the push portion.

4. The immersion cooling system of claim 2, wherein the driving member further comprises two pivot portions, the two pivot portions extend from opposite sides of the upright portion, the two pivot portions are pivotally connected to the base by a first shaft, each of the two busbar protection modules further comprises a first torsion spring, and the first torsion spring is disposed on the first shaft and connected to the base and the upright portion.

5. The immersion cooling system of claim 2, wherein the cover is pivotally connected to the upright portion by a second shaft, each of the two busbar protection modules further comprises a second torsion spring, and the second torsion spring is disposed on the second shaft and connected to the cover and the upright portion.

6. The immersion cooling system of claim 1, wherein when the two covers cover the busbar, two oblique ends of the two covers are arranged side by side.

7. The immersion cooling system of claim 1, wherein when the two covers cover the busbar, two oblique ends of the two covers are staggered with each other.

8. The immersion cooling system of claim 1, wherein the cover comprises two concave portions and the two concave portions are located at two opposite corners of the cover.

9. The immersion cooling system of claim 1, wherein the cover has a plurality of through holes formed therein.

10. The immersion cooling system of claim 1, wherein the cover comprises a non-linear abutting surface and the non-linear abutting surface abuts against a side wall of the busbar during a movement of the cover.

11. The immersion cooling system of claim 1, wherein the base comprises a positioning portion, the busbar comprises a positioning hole, and the positioning portion is inserted into the positioning hole.

12. The immersion cooling system of claim 1, further comprising two collection containers disposed adjacent to the two busbar protection modules.

13. The immersion cooling system of claim 1, further comprising a data processing device, wherein the data processing device comprises an electrical connector; when the data processing device moves toward the busbar, the data processing device pushes the two driving members of the two busbar protection modules, such that the electrical connector is connected to the busbar exposed between the two covers.

14. The immersion cooling system of claim 13, wherein the cooling tank comprises two stop portions located at opposite sides of the busbar; when the electrical connector is connected to the busbar, the two stop portions stop the data processing device.

15. The immersion cooling system of claim 13, wherein an avoidance space is formed around the electrical connector of the data processing device; when the electrical connector is connected to the busbar, the avoidance space receives the two covers away from each other.

16. A busbar protection module comprising:
a base;
a driving member pivotally connected to the base, the driving member comprising a push portion, a connecting portion and an upright portion, the push portion extending obliquely from the connecting portion, the upright portion extending upward from the connecting portion and being opposite to the push portion; and
a cover pivotally connected to the upright portion;
wherein a horizontal moving direction of the cover is perpendicular to a vertical moving direction of the push portion.

17. The busbar protection module of claim 16, wherein the driving member further comprises two pivot portions, the two pivot portions extend from opposite sides of the upright portion, the two pivot portions are pivotally connected to the base by a first shaft, each of the two busbar protection modules further comprises a first torsion spring, and the first torsion spring is disposed on the first shaft and connected to the base and the upright portion.

18. The busbar protection module of claim 16, wherein the cover is pivotally connected to the upright portion by a second shaft, each of the two busbar protection modules further comprises a second torsion spring, and the second torsion spring is disposed on the second shaft and connected to the cover and the upright portion.

19. The busbar protection module of claim 16, wherein the cover comprises two concave portions and the two concave portions are located at two opposite corners of the cover.

20. The busbar protection module of claim 16, wherein the cover has a plurality of through holes formed therein.

21. The busbar protection module of claim 16, wherein the base comprises a positioning portion, a busbar comprises a positioning hole, and the positioning portion is inserted into the positioning hole to position the busbar protection module on a side wall of the busbar.

22. The busbar protection module of claim 21, wherein the cover comprises a non-linear abutting surface and the non-linear abutting surface abuts against the side wall of the busbar during a movement of the cover.

* * * * *